United States Patent
Zhang et al.

(10) Patent No.: US 7,280,400 B2
(45) Date of Patent: Oct. 9, 2007

(54) REDUCING SNEAK CURRENTS IN VIRTUAL GROUND MEMORY ARRAYS

(75) Inventors: Ruili Zhang, Folsom, CA (US); Richard Fackenthal, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 11/167,354

(22) Filed: Jun. 27, 2005

(65) Prior Publication Data

US 2006/0291266 A1    Dec. 28, 2006

(51) Int. Cl.
G11C 16/04     (2006.01)
G11C 7/00      (2006.01)
G06F 13/00     (2006.01)

(52) U.S. Cl. .......................... 365/185.16; 365/185.14; 365/185.28; 365/185.29; 365/220; 711/168; 711/203

(58) Field of Classification Search ........... 365/185.05, 365/185.11, 185.17, 185.28, 189.06, 189.09, 365/189.11, 230.06, 185.23, 233, 220, 233.5
See application file for complete search history.

(56) References Cited

U.S. PATENT DOCUMENTS

| | | | | |
|---|---|---|---|---|
| 6,324,116 | B1 * | 11/2001 | Noh et al. | 365/230.05 |
| 2004/0063283 | A1 * | 4/2004 | Guterman et al. | 438/257 |
| 2006/0227616 | A1 * | 10/2006 | Zhang | 365/185.22 |
| 2006/0285421 | A1 * | 12/2006 | Zhang | 365/230.06 |

OTHER PUBLICATIONS

Zhang, "Reducing Sneak Currents in Virtual Ground Memory Arrays", U.S. Appl. No. 11/103,064, Apr. 11, 2005.

* cited by examiner

Primary Examiner—Lý Duy Pham
(74) Attorney, Agent, or Firm—Trop, Pruner & Hu, P.C.

(57) ABSTRACT

In a virtual ground memory array, sneak currents between input/output groups of sensed cells may be reduced by providing at least one column of programmed cells between the input/output groups. The sneak currents may arise when cells in each of two adjacent I/O groups are sensed (or programmed) at the same time.

24 Claims, 7 Drawing Sheets

REDUCING SNEAK CURRENTS IN VIRTUAL GROUND MEMORY ARRAYS

BACKGROUND

This invention relates generally to sensing virtual ground flash memory arrays.

In virtual ground flash memory arrays, sneak currents may occur during sensing. Each input/output group of columns of cells to be sensed may be coupled to a different sense amplifier so that it is possible to sense cells within different groups at the same time. Two cells, one in each input/output group of columns may be sensed as a pair. As a result, sneak currents may result between activated, adjacent input/output groups. These sneak currents may result in excessive power dissipation and/or sensing errors.

Thus, there is a need for ways to reduce sneak currents.

DETAILED DESCRIPTION

Figure 1:
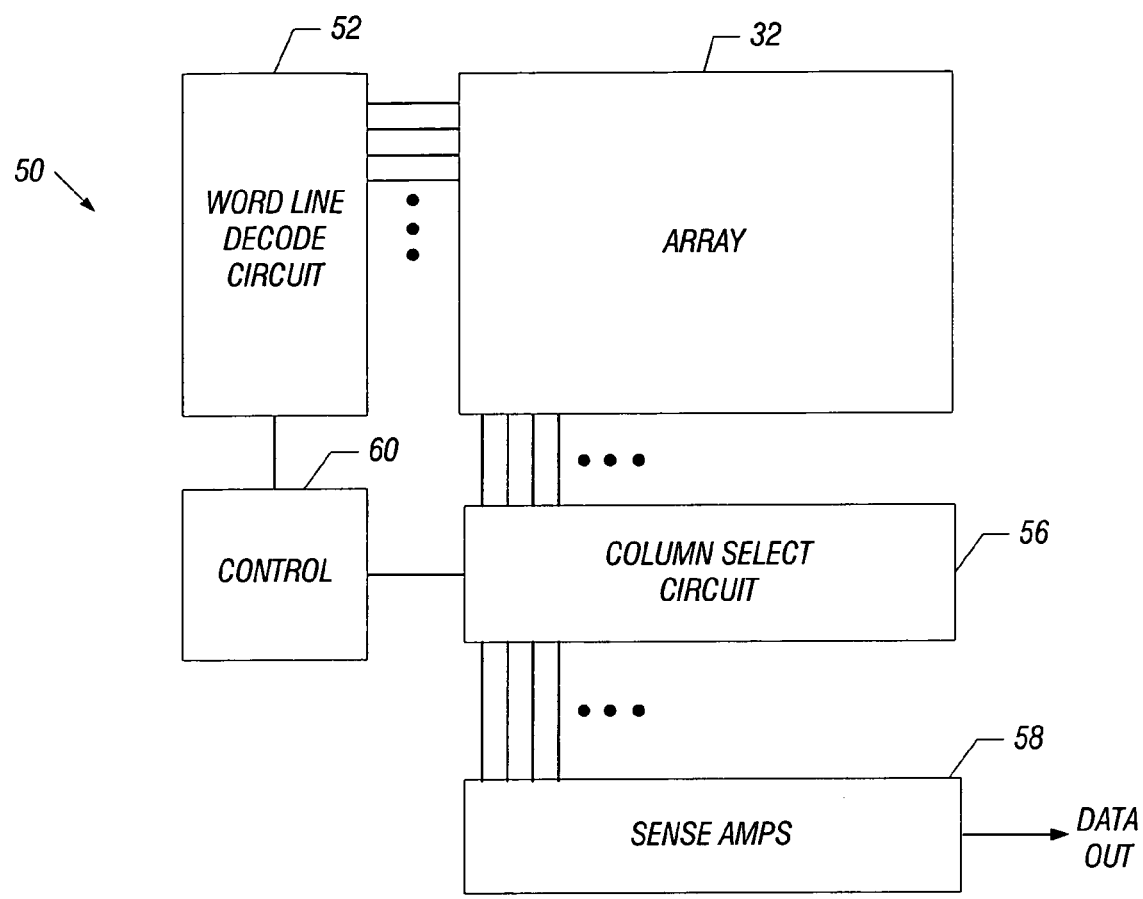
FIG. 1 is a schematic depiction of one embodiment of the present invention.

Referring to FIG. 1, a flash memory 50 may include an array 32 which uses a virtual ground arrangement. A virtual ground arrangement removes the contact from the drain of the memory cells in the array 32. The array 32 may be addressed by a word line decode circuit 52 and a column select circuit 56. The column select circuit 56 may be coupled to the sense amplifiers 58 which provide output data.

Figure 2:
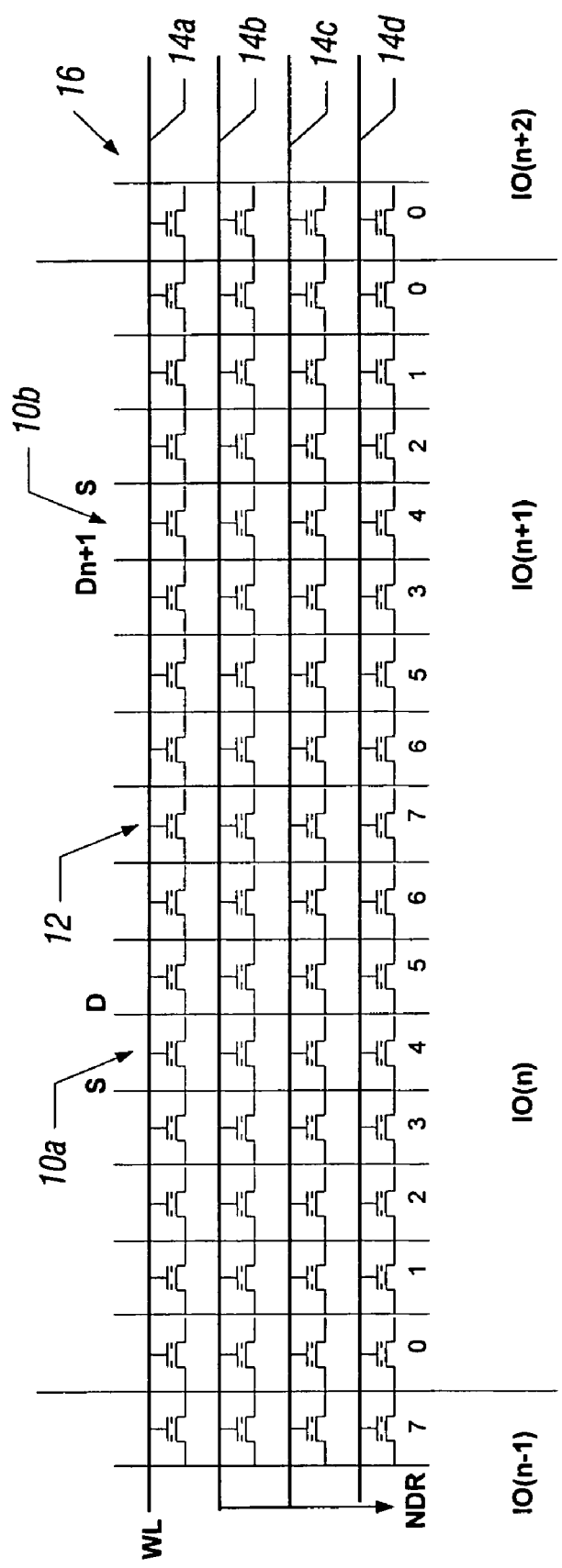
FIG. 2 is a depiction of a portion of an array in accordance with one embodiment.

The array 32 may include input/output (I/O) breaks (not shown in FIG. 1). As shown in FIG. 2, an I/O break 12 may be made up of a column of programmed cells between two adjacent input/output groups, indicated as IO(n) and IO(n+1). In a multiple level flash array, for example, the cells of the I/O break 12 may all be programmed to the highest threshold voltage level.

Referring to FIG. 2, the array 32 may include a polysilicon word line (WL) 14a which is strapped by a metal word line. High voltage is applied to the word line 14a to turn on a selected cell in each of two adjacent I/O groups of columns (n) and (n+1). Word lines 14b, 14c, 14d are biased at ground or negative voltage to shut off all the connected cells on those word lines. Since there are generally no contacts at either drain or source, the bitlines 16 may be formed by the diffusions. Then, the diffusion bitlines 16 are strapped by a metal bitline (not shown) to reduce the resistance. In some embodiments, the density of the bitline straps can be 32 rows per strap or 16 rows/strap. One I/O group may contain 16 bitlines or 32 bitlines.

Likewise, a plurality of bitlines 16 may extend vertically in FIG. 2. Each group of the bitlines 16 may be coupled to a y select transistor (not shown), for example, at the bottom of the bitline 16. A metal 3 or third metal line (not shown) may be coupled to each of the bitlines 16 below a local bitline select transistor (not shown in FIG. 2). Most of the local bitline select transistors of any I/O group may be coupled to a bitline diffusion which is strapped to a metal 2 bitline in some embodiments of the present invention.

When the word line 14a is activated to select cells along that word line, a cell 10a (cell number 4) in I/O(n) and a cell 10b (also cell number 4) in I/O(n+1) are both selected. In each I/O group, 7 cells are depicted per row, numbered 0-6, at the bottom. Cells 6, in adjacent I/O groups, are adjacent one another and cells 0 are spaced most far apart between two adjacent I/O groups.

Figure 3:
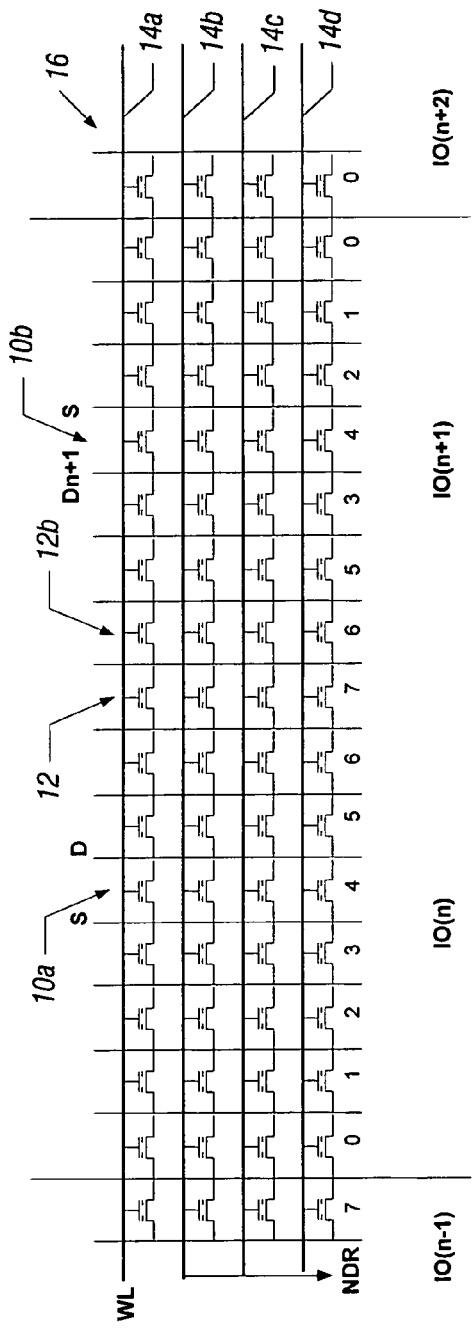
FIG. 3 is a depiction of a portion of an array in accordance with one embodiment.

In order to form the I/O break 12, in some embodiments, two columns 12a and 12b may form the I/O break 12, as indicated in FIG. 3. The I/O break 12 may be programmed at one time, if possible. In one embodiment, the cells of the I/O groups and the I/O break may be multilevel cells having more than two threshold voltage levels, including a lowest and highest threshold voltage level. Since all of the cells may be programmed to the same, relatively high threshold voltage, they may use the same programming word line voltage, if the pump that supplies the programming current has sufficient capacity. In one embodiment, the I/O break 12 cells may be programmed during erase time, which is a long process, and results in no access penalty to the memory. Generally, if there are n I/O groups, there are n–1 I/O breaks 12, in one embodiment of the present invention, as depicted in FIG. 3.

In the embodiment shown in FIG. 2, the drains and sources are symmetrical, with the sources to the left in the I/O n and the sources to the right in the I/O n+1. Thus, it is arbitrary which one is called the drain and which one is called the source and the higher voltage can be applied to either cell side in some embodiments. However, it may be advantageous to have adjacent I/Os with sources on opposed sides of the cells.

In some embodiments of the present invention, the sneak currents can be controlled in a simple way without breaking up or forming isolating gaps between the I/O groups.

The use of two columns of I/O cells to form the breaks 12a and 12b may suffer from less floating gate charge loss and, thus, may stand for a longer time in some embodiments. In addition, the use of two adjacent columns of I/O breaks 12, may, in some embodiments, reduce the number of local bitline select transistors. The I/O breaks 12 are generally needed more on the drain side. While the drain side bitline voltage may be higher, the I/O break cells will generally remain off. If the I/O break cells are turned on during programming, there still may be insufficient current flowing through the "on" break cell to cause any kind of disturb.

In both programming and sensing, two or more I/O groups may participate. The programming of the I/O cells in each group can be done at the same time. The programming of the array cells may be done after the programming of the I/O break cells, in some embodiments, so that the I/O break cells may be available to prevent sneak currents during programming. The I/O break cells may all be programmed to the highest threshold voltage level by operation of a control which always re-programs all of the I/O break cells. The control 60 may be a processor such as a microcontroller or microprocessor.

Figure 4:
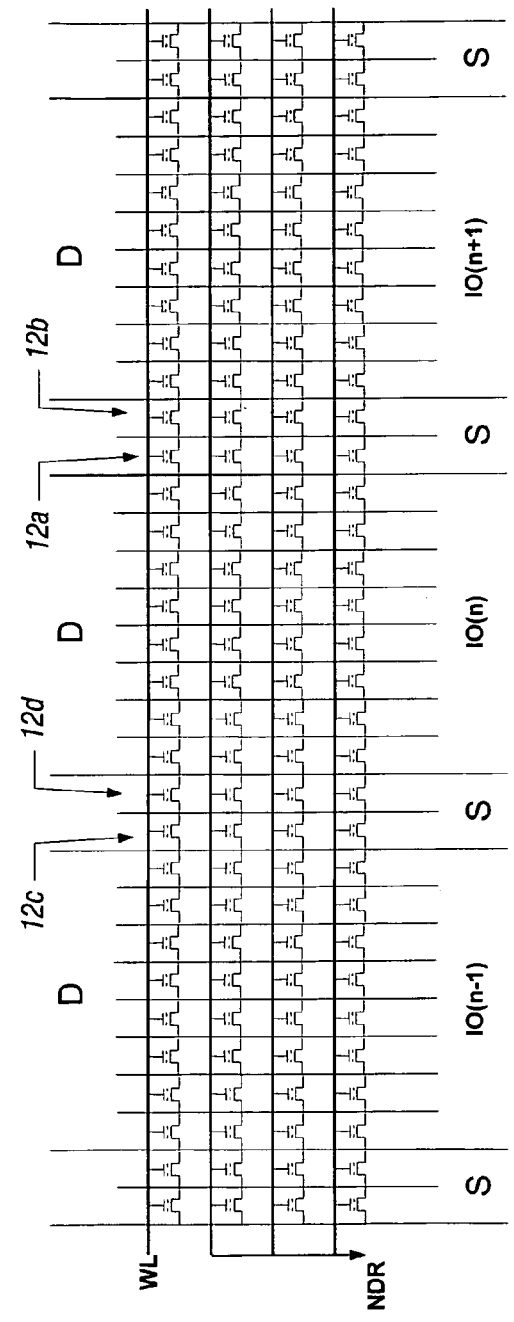
FIG. 4 is a depiction of the array of FIG. 3 during programming or sensing.

In the embodiment shown in FIG. 4, the I/O groups have been used on the drain side during programming and sensing of the I/O cells. The drivers for local bitline path select can be the same.

A program verify of the I/O break cells can be undertaken to ensure that the cells reach their higher threshold voltage. This may be done by sensing two cells in parallel and ensuring that the sum of the currents flowing through the two cells is below a certain number that guarantee both cells are solidly in the appropriate programmed state. This can be sensed in two steps by exchanging source and drain to reduce overshoot.

FIG. 4 shows the circuit of FIG. 3 but also shows an additional input/output group I/O(n−1). FIG. 4 shows the biases for sensing or programming in one embodiment. A first set of I/O break columns 12a and 12b separate I/O(n) and I/O(n+1) as in the case of FIG. 3. An additional pair of I/O break columns 12c and 12d separate I/O(n−1) and I/O(n). During programming or sensing, a high signal may be provided on the word line (WL). A cell in each of two adjacent I/O groups may be addressed. In the situation shown in FIG. 4, all of the columns in each I/O group may be selected through their drains or leftmost column while the column between the I/O breaks, columns 12a and 12b, or 12c and 12d, may be coupled to source potential. Generally, the source potential is lower than the drain potential. Thus, the drivers for the y path select may be coupled to the drains as opposed to the sources of the cells to be sensed.

Figure 5:
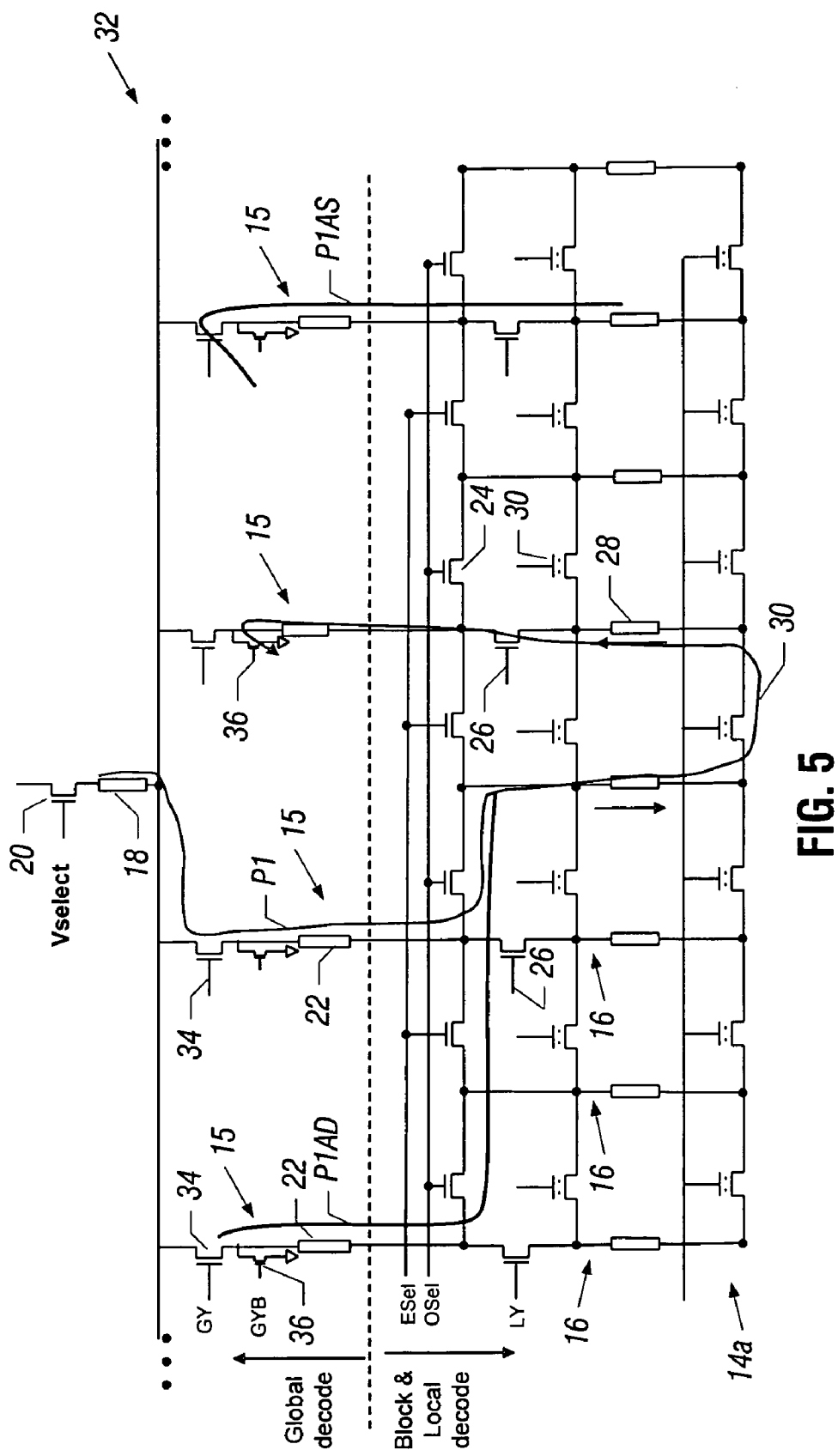
FIG. 5 is a schematic depiction of one architecture for an array in accordance with one embodiment of the present invention.

According to one architecture for the array 32, called the swap architecture, shown in FIG. 5, an array select transistor 20 couples a line having an inherent resistance 18. The transistor 20 enables a connection to a selected global bitline 15 via the path P1. The path P1 includes a global drain select transistor (GY) 34, a global source select transistor (GYB) 36 and the selected cell 30. The path P1 then extends through the inherent global bitline resistance 22. The global bitlines 15 are indicated above the dotted lines and the local bitlines 16 are indicated below the dotted lines.

While, normally, a local bitline select transistor (LYS) would be included on each global bitline, the local bitline select transistors 26 are moved down onto every other local bitline 16. Then, only one local bitline select transistor 26 is in the path P1, reducing the voltage drop by the voltage drop inherent in eliminating one local bitline select transistor 26 from each select path such as the path P1. Thus, the selected cell 30 may be accessed along the path P1 through the local bitline resistances 28 and one local bitline transistor 26 up to the global bitline source select transistor 36.

In the architecture shown in FIG. 5, there is one global bitline 15 for every other local bitline 16. One local bitline 16 is selected by the even block select line (ESel) and the other is selected by a signal on the odd block select line (OSel). The shunt devices 24 have their gates coupled to ESel or OSel to couple two local bitlines 16.

In a swap architecture, the number of global select transistors 34, 36 may be (n/2+1)×2, where the number of I/O groups is n. For 16 cells per I/O group, the count of drivers is 18 and for 32 cells per. I/O group, the driver count is 34. The number of global bitlines 15 may be (n+1) per two I/O groups.

The decoding of a shunt device control may be implemented variously. In one embodiment, there is even/odd decoding and in another embodiment there is full decoding. For even/odd decoding there may be a total of three control signals at the local block level: LYS, OSel, and ESel to control the LYS transistors and shunt devices.

In the fully decoded structure, the odd and even select lines (OSel and ESel) are eliminated and each bitline is an independent bitline. For the full decoding case, only the shunt device in parallel with the selected flash cell is shut off, providing parallel global bitlines (paths P1AD, P1AS, and P1) and further reducing the global bitline voltage drop. Reducing the global bitline voltage drop may reduce the maximum voltage that unselected cells see. However, such an embodiment would operate substantially as depicted in FIG. 5.

For a full decode architecture, a source pull down transistor may be provided at the drain side to create drain global bitline (GY) 34/source global bitline (GYB) 35 transistor pairs. Two pairs of GY/GYB control transistors may be used, without addition for local Y-select (LY) drivers 26. If no source pull down transistor is used on the drain path, it is only necessary to add LY control signals and LY gate select drivers.

If the number of cells per I/O group is n, the number of LY drivers may be (2n+1)×2. In one embodiment, if the source of the LY select drivers can use the supply voltage signal, then for 16 cells per I/O group, the driver count is 66 and for 32 cells per I/O group, the driver count is 130.

In some embodiments, eliminating one transistor per local bitline select path may reduce the voltage drop by about 150 millivolts. Thus, the architecture depicted in FIG. 5 may be called the swap architecture because a shunt device is swapped between the global and the local bitlines.

Figure 6:
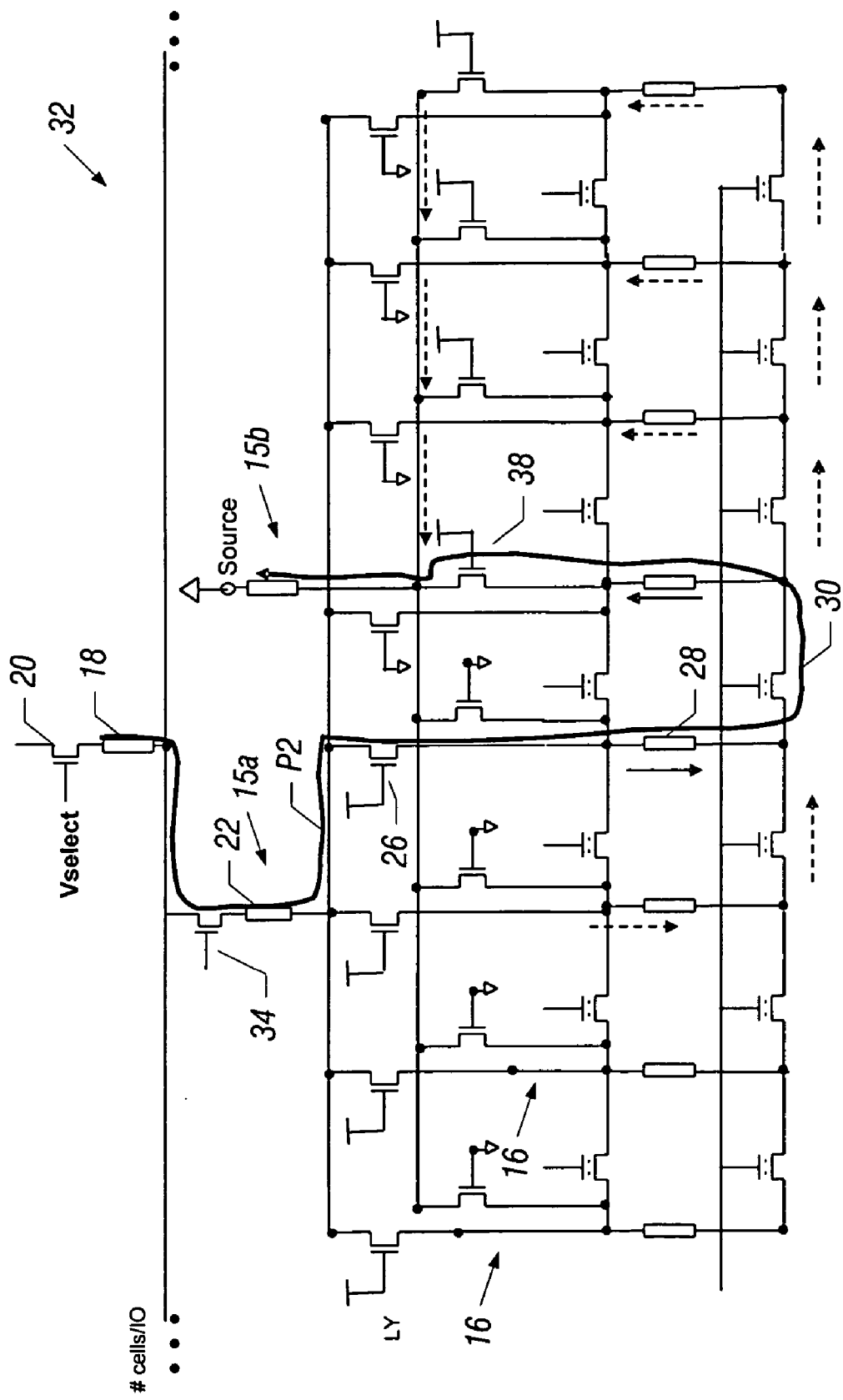
FIG. 6 is a schematic depiction of another architecture in accordance with another embodiment of the present invention.

Referring next to FIG. 6, in accordance with another architecture, which may be called a reduced global bitline architecture, the number of global bitlines 15 is reduced so that there is only a single global bitline 15a for the drain and a single global bitline 15b for the source in one embodiment. A global select transistor 34 may be provided on the global bitline 15a and an inherent resistance 22 is indicated for that bitline 15a. Thus, the effect is to move more decoding to the local bitlines 16, making the decoding more complicated in the local bitlines 16.

However, the reduced number of global bitlines 15 allows the global bitlines 15 to be made wider because there is more available room and because the global bitlines 15 need not follow the pitch of the local bitlines 16. As a result, the resistance of the global bitlines 15 may be reduced, reducing the voltage drop when accessing a selected cell 30 through a local bitline 16 having an inherent resistance 28, indicated schematically.

Again, the local select transistors 26 select the appropriate local bitline 16 on the selected path P2. The transistors 38 provide the source connection for the overall path P3.

Figure 7:
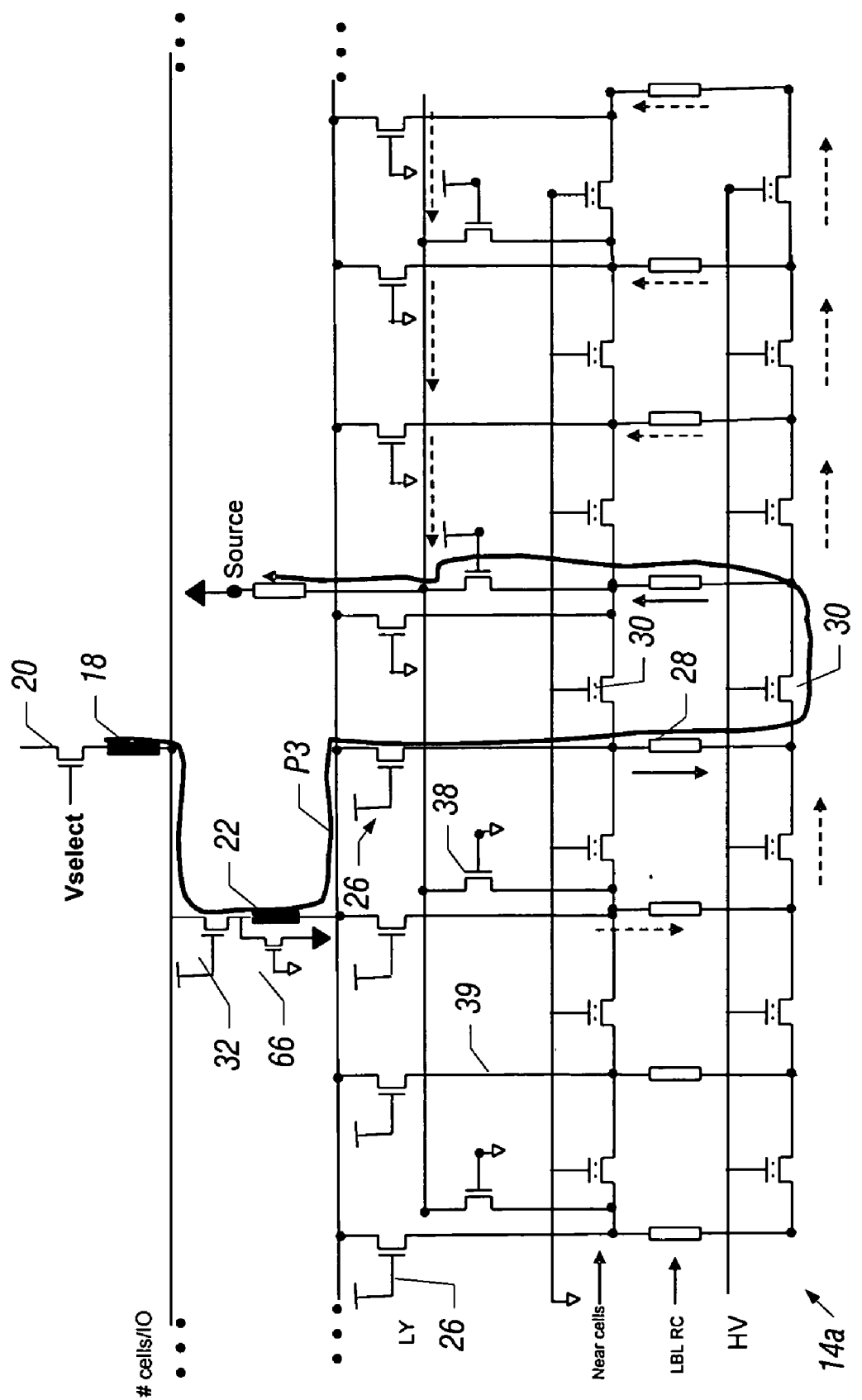
FIG. 7 is a schematic depiction of still another architecture in accordance with one embodiment of the present invention.

Finally, referring to FIG. 7, in a reduced source connection architecture, every other one of the transistors 38 in the reduced global bitline architecture, shown in FIG. 6, may be eliminated (as indicated, for example, at 39) and replaced with a single transistor 38. Thus, for example, on the select path P3 in FIG. 7, there are no adjacent transistors 38 on adjacent local bitlines 16, as is the case of the path P2 in FIG. 6. The elimination of transistors 38 reduces the number of transistors in the path P3 compared to the path P2, also reducing the voltage drop.

For a reduced source connection architecture, a source pull down transistor may be used on the drain side for sensing the I/O cells and the local bitline transistor 26 results in no change. A control may be provided for the source pull down and the GY select transistor 32. Instead of having a single pair of GY/GYB control signals, two pairs of signals may be used. Otherwise, local bitline select transistors 26 may be necessary.

Before programming or sensing, some of the bitlines may need to be discharged first. In a pre-discharge step, the transistors 66 are turned on to discharge the path P3. Since some local bitlines on the source side are floating during sensing or programming, the sneak path impedance is increased and this leads to reduction of sneak current.

If the number of cells per I/O group is n, the number of local bitline select transistors 26 may be 3n+4. On the drain side, there are 2×(n+1) drivers and on the source side there are n+2 drivers. Thus, for n=16, the number of drivers is 52 and for n=32, the number of drivers is 100.

For example, the word line 14*a* bias may be about 2.8 volts and 70 percent of the cells may have a threshold voltage greater than 2 volts.

Figure 8:
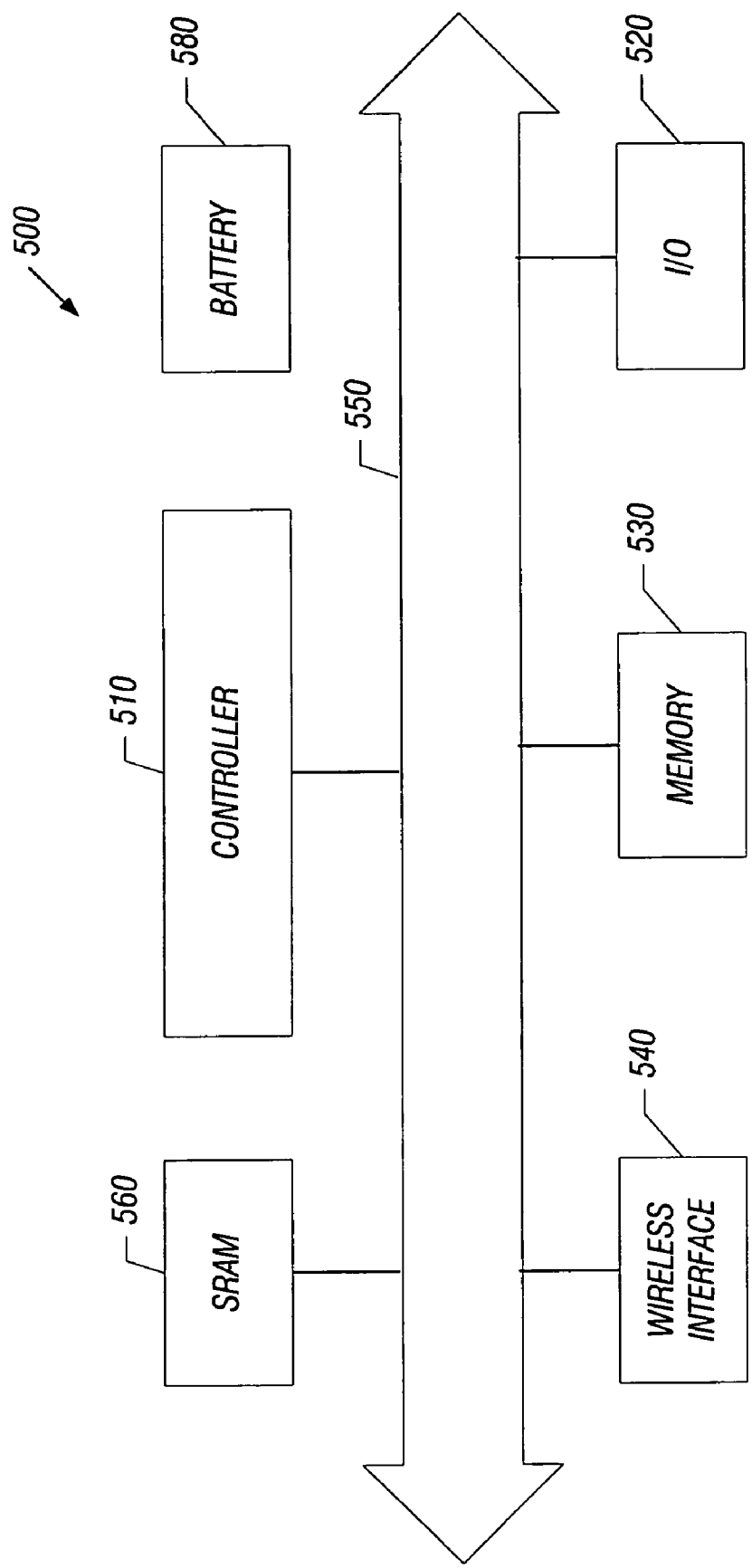
FIG. 8 is a depiction of a system using the memory of FIG. 1 in accordance with one embodiment of the present invention.

Referring to FIG. 8, in accordance with some embodiments of the present invention, a processor-based system 500 may be a personal computer, a laptop computer, a personal digital assistant, a cellular telephone, a digital camera, an entertainment system, a media player, or any of a variety of other processor-based systems. It may include a memory 530, which may be implemented by the memory 50, in some embodiments. It may also include a controller 510, which may be, for example, a microprocessor, multiple microprocessors, a digital signal processor, or a microcontroller, to mention a few examples. Coupling the controller 510 and the memory 530 may be a bus 550. The bus 550 may also be coupled to other memories, such as a static random access memory (SRAM) 560, an input/output device 520, and a wireless interface 540. The wireless interface 540 may be any system which enables wireless communications, including cellular wireless communications and networked wireless communications, to mention a few examples. The I/O device 520 may be any conventional I/O device including, among others, a display, a mouse, a keyboard, or the like.

Thus, in some embodiments, wireless communications may be implemented by the system 500 in which messages stored in the memory 530 may be communicated over the wireless interface 540. As one example, the wireless interface 540 may be a dipole antenna. Battery power 580 may be supplied in some embodiments, although the present invention is not limited to wireless applications or to battery powered applications.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   programming a column of nonvolatile memory cells between two groups of memory cells to reduce sneak currents between the two groups of memory cells when they are sensed at the same time.

2. The method of claim 1 including providing said column between adjacent input/output groups.

3. The method of claim 1 including providing at least a pair of columns of programmed cells between two groups of memory cells.

4. The method of claim 1 wherein said memory cells are cells having a lowest and a highest threshold level, and the programmed cells have a threshold voltage associated with the highest threshold level of said multilevel cells.

5. The method of claim 1 including erasing cells in said groups and programming said column while erasing.

6. The method of claim 1 including programming the entire column of programmed cells at the same time.

7. A nonvolatile memory comprising:
   a virtual ground memory array with at least two groups of memory cells to store information;
   a column of memory cells between said groups; and
   a control, said control programming all of said cells in said column while erasing memory cells in said groups.

8. The memory of claim 7 wherein said memory cells are non-volatile memory cells.

9. The memory of claim 7 wherein said cells include a pair of opposed terminals which are interchangeable.

10. The memory of claim 7 including a pair of adjacent columns of memory cells between said groups.

11. The memory of claim 10, said control to program all the cells of both columns to the same threshold voltage.

12. The memory of claim 7 wherein said memory array is split into at least two input/output groups with the column of memory cells between said groups.

13. The memory of claim 7 wherein said memory is a multilevel memory.

14. The memory of claim 12 wherein said multilevel memory has a lowest and a highest threshold voltage level, said column of memory cells programmed to said highest threshold level.

15. The memory of claim 7 wherein said control to program the entire column of program cells at the same time.

16. A system comprising:
   a processor;
   a static random access memory coupled to said processor; and
   a nonvolatile memory coupled to said processor including a virtual ground memory array with at least two groups of memory cells to store information, a control, and a column of memory cells between said groups, said control programming all of said cells in said column to a programmed threshold voltage state while erasing memory cells in said groups.

17. The system of claim 16 wherein said memory cells are non-volatile memory cells.

18. The system of claim 16 wherein each cells include a pair of opposed terminals which are interchangeable.

19. The system of claim 16 including a pair of adjacent columns of memory cells between said groups.

20. The system of claim 19, said control to program all the cells of both columns.

21. The system of claim 16 wherein said memory array is split into at least two input/output groups with the column of memory cells between said groups.

22. The system of claim 16 wherein said memory is a multilevel memory.

23. The system of claim 21 wherein said multilevel memory has a lowest and a highest threshold voltage level, said column of memory cells programmed to said highest threshold level.

24. The system of claim 16 wherein said control to program the entire column of program cells at the same time.

* * * * *